(12) United States Patent
Booth (10) Patent No.: US 6,650,711 B1
(45) Date of Patent: Nov. 18, 2003

(54) QUADRATURE MODULATION WITH REDUCED PHASE-ERROR DISTORTION

(75) Inventor: Richard W. D. Booth, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 538 days.

(21) Appl. No.: 09/585,591

(22) Filed: Jun. 2, 2000

(51) Int. Cl.$^7$ ................................. H03C 3/40
(52) U.S. Cl. ........................................ 375/302
(58) Field of Search ........................ 375/302, 295, 375/300, 377, 353

(56) References Cited

U.S. PATENT DOCUMENTS 4,628,507 A * 12/1986 Otami ........................ 375/254

FOREIGN PATENT DOCUMENTS

GB      2354649 A  *  3/2001  ............ H03C/3/09

* cited by examiner

*Primary Examiner*—Chi Pham
*Assistant Examiner*—Kevin M Burd
(74) *Attorney, Agent, or Firm*—Thelen Reid & Priest LLP; Robert E. Krebs (57) ABSTRACT

A system and method of modulation is described that initially over-modulates with an information signal at a scale that is N times an intended modulation scale and then subsequently, frequency-divides the over-modulated signal by the same factor of N to generate a modulated signal having the intended modulation scale wherein distortion of the resulting modulated signal is reduced by a factor of 20 $\log_{10}(N)$dB.

17 Claims, 5 Drawing Sheets

QUADRATURE MODULATION WITH REDUCED PHASE-ERROR DISTORTION

BACKGROUND OF THE INVENTION

1. Field of the Invention

The present invention relates to phase modulation, and in particular to reducing amplitude distortion during in-phase quadrature (I-Q) phase modulation.

2. State of the Art

Wireless communication systems generally rely on phase-based modulation formats such as Gaussian minimum-shift keying (GMSK). One technique for performing phase modulation in these systems is by phase modulating a voltage controlled oscillator (VCO) using dual port tuning/modulation. However, this approach tends to be inaccurate and has several disadvantages such as it requires a fairly critical determination of the output VCO loop bandwidth in an effort to suppress phase noise and spurious signals while minimizing the effects of frequency pulling. An alternative phase modulation technique is quadrature modulation.

Figure 1:
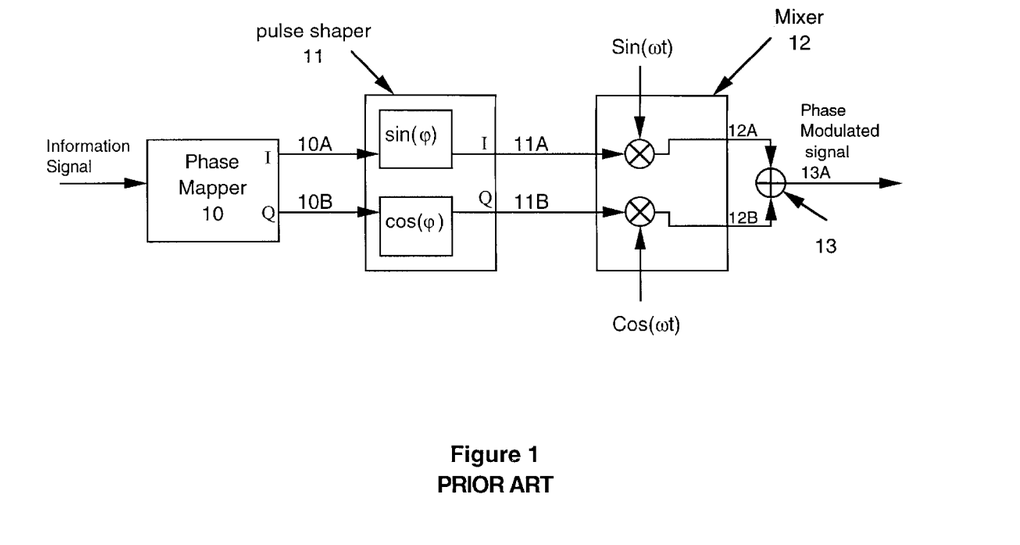
FIG. 1 shows a prior art quadrature modulation system.

Quadrature modulation is a modulation technique in which separate in-phase (I) and quadrature (Q) signals are used to perform the modulation. FIG. 1 shows a prior art design of a quadrature modulation system which includes a phase mapper 10 generating a quadrature pulse stream which includes an in-phase (I) component of a pulse stream 10A and a quadrature (Q) component of a pulse stream 10B together representative of an input digital information signal. The I and Q pulse streams are coupled to a pulse shaping block 11 which converts pulse streams 10A and 10B into band limited I and Q modulation component signals 11A and 11B (i.e., in-phase component=$\sin(\phi)$ and quadrature component=$\cos(\phi)$). The I and Q modulation component signals, 11A and 11B, are coupled to mixer block 12 along with I and Q carrier signals ($\cos(\omega_c t+\theta)$ and $\sin(\omega_c t+\theta)$, respectively) so as to superimpose each of the quadrature modulation component I and Q signals 11A and 11B onto a carrier signal to generate analog signal 12A, $Q(t) \cdot \sin(\omega_c t+\theta)$, and analog signal 12B, $I(t) \cdot \cos(\omega_c t+\theta)$. Signals 12A and 12B are summed by summer 13 to generate a single phase modulated RF signal $s(t) \approx \cos(\omega_c t+\theta+\theta)$((13A, FIG. 1), where $$\phi = \tan^{-1}\frac{Q}{I}.$$

Ideally, for pure phase modulation, the output signal 13A is a constant-envelope signal (i.e., modulated signal with constant amplitude). However, due to gain and offset errors which are inherently caused by conventional quadrature modulator circuit imperfections, output signal 13A exhibits signal distortion components that are comparable in amplitude to the amplitude response at the frequency of interest. This type of distortion can be detrimental to system performance, and, more particularly, can result in the transmission of erroneous signals. In particular, in cases in which output signal 13A is subsequently applied to a tracking (or translation) phase-locked loop, such as in a cellular phone handset, the spurious signals from the quadrature modulator can be amplified, rather than suppressed.

There are many manners in which to reduce spurious output signals from a quadrature modulator due to practical circuit imperfections, namely, the matching of circuit balance, elimination of circuit offsets, and quadrature accuracy improvement, as described in "Taming the Quadrature Modulator" by E. McCune, *Proceedings of the Wireless Symposium* 2000 (Feb. 22–25, 2000), San Jose, Calif. These techniques are cumbersome, time-consuming, and expensive. Thus it is generally accepted that the nearly universal use of quadrature modulators in digital cellular handsets in high-volume manufacturing naturally involves spurious signals due to these practical circuit imperfections.

What is needed is a system and method in which to use quadrature modulation so as to generate a phase-modulated signal having reduced distortion.

SUMMARY OF THE INVENTION

A system and method of modulation is described which generates a modulated signal having an intended modulation scale and having reduced spurious signals. According to one embodiment of the method, initially, an information signal is quadrature-modulated at a modulation scale that is a factor of N times that of the intended modulation scale (referred to herein as quadrature over-modulation). The resulting quadrature over-modulated signal is then frequency divided by the same factor of N. The net effect of the over-modulation and subsequent frequency division is that spurious signals that are created during the quadrature over-modulation process are logarithmically reduced by a factor of $20 \log_{10}(N)$ dB, thereby significantly reducing spurious signals seen within the resulting modulated signal.

In accordance with another embodiment of the method of modulation, quadrature over-modulation is performed on an information signal to generate an over-modulated phase-modulated signal including I and Q continuous signals representing a modulation scale that is N times an intended modulation scale. Each of the I and Q signals are then mixed with carrier signals having a frequency that is N times an intended carrier frequency and are summed to create a single, constant-envelope over-modulated signal. The over-modulated signal is then converted into a digital signal and is frequency divided by a factor of N to generate a modulated signal having the intended modulation scale and the intended carrier frequency.

One embodiment of the system of modulation includes a quadrature over-modulator for generating a continuous over-modulated signal including I and Q component signals representative of the input information signal where the modulation scale representing the I and Q component signals is N times an intended modulation scale, a mixer for mixing each of the I and Q component signals onto a carrier having a frequency that is N times the intended carrier frequency to generate I and Q over-modulated RF signals, a summer for summing the I and Q over-modulated signals to generate a single, constant-envelope over-modulated signal, a converter (such as a limiter) for converting the over-modulated signal into a digital signal, and a digital frequency divider for dividing the frequency of the digital signal by N to generate a modulated signal having the intended modulation scale and the intended carrier frequency.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

In the following description, numerous specific details are set forth, such as specific functional elements or system structures in order to provide a thorough understanding of the present invention. It will be apparent, however, to one skilled in the art that these specific details need not be employed to practice the present invention. In other instances, well known modulation system operation and theory have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention. It should be understood that a quadrature signal refers to a signal having an in-phase component signal and a quadrature component signal.

Figure 2A:
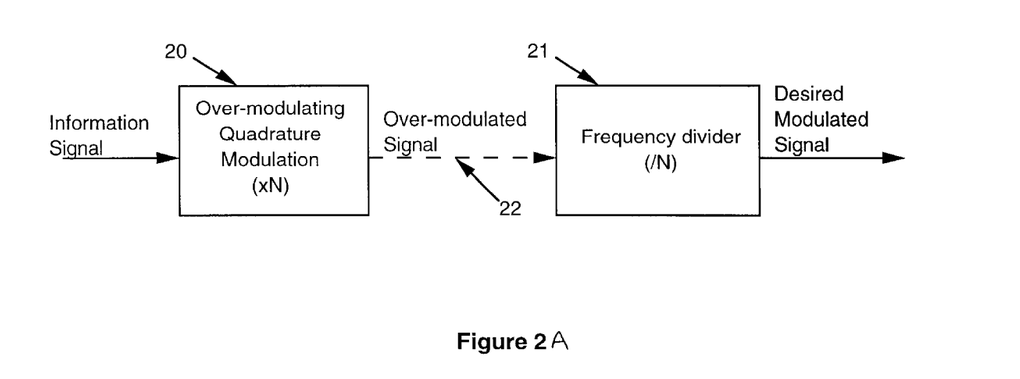
FIG. 2A illustrates the basic technique of a quadrature over-modulation.

FIG. 2A illustrates the quadrature over-modulation technique for reducing amplitude distortion which occurs in prior art quadrature modulation systems. Over-modulation or extended modulation is a technique described in "Extended Phase-Shift Keying," Ph.D. Dissertation by Earl McCune, University of California Engineering, Davis, Calif., August 1998, Chapter 3, pp: 25–69 (incorporated herein by reference), which entails extending or scaling the modulation process over a phase range greater than was conventionally thought possible.

Figure 2B:
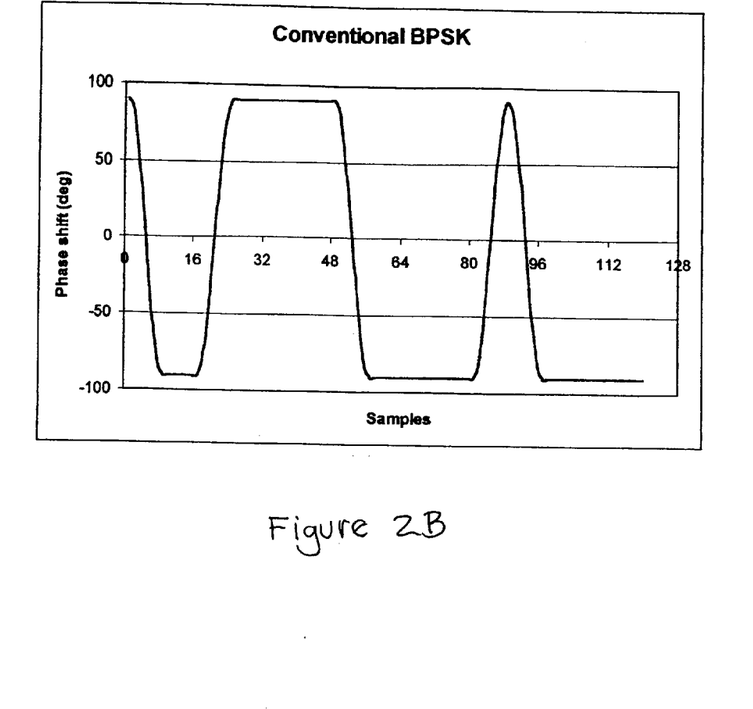
FIGS. 2B and 2C show phase and magnitude waveforms in which modulation is performed over a conventional phase range.
Figure 2C:
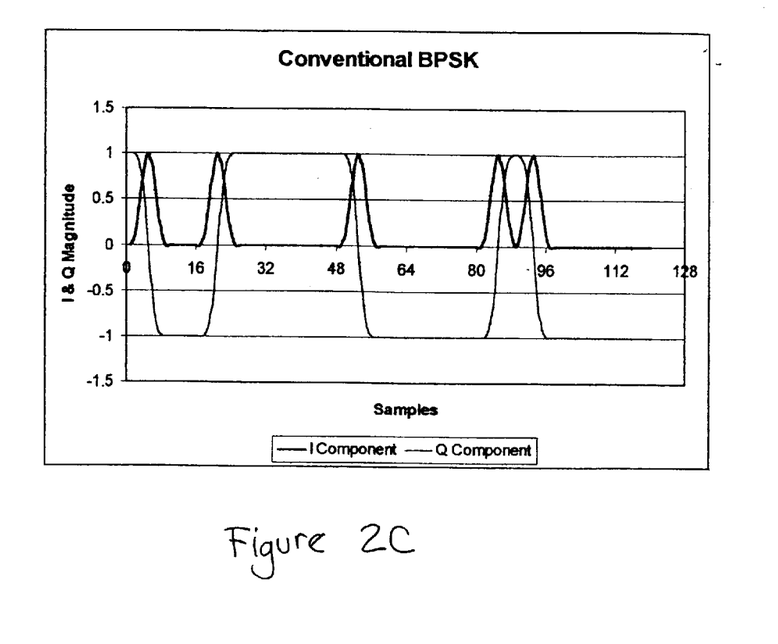

For instance, conventional band-limited phase shift keying is performed over a 180° phase range as shown by the phase vs. time modulation waveform sample in FIG. 2B. FIG. 2C shows corresponding I and Q magnitude component waveforms of the modulated waveform sample shown in FIG. 2B.

Figure 2D:
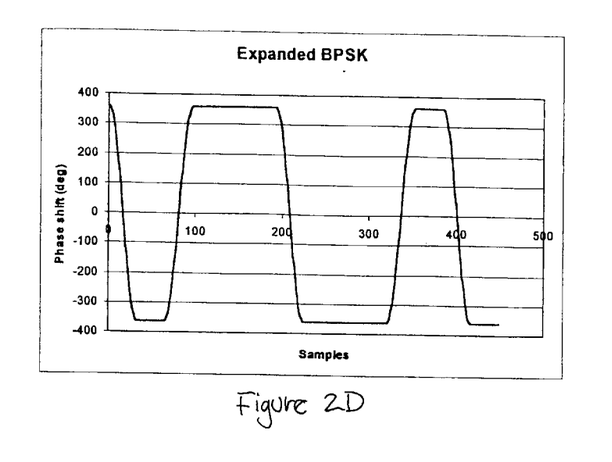
FIGS. 2D–2F show phase and magnitude waveforms in which over-modulation is performed over an extended phase range.
Figure 2E:
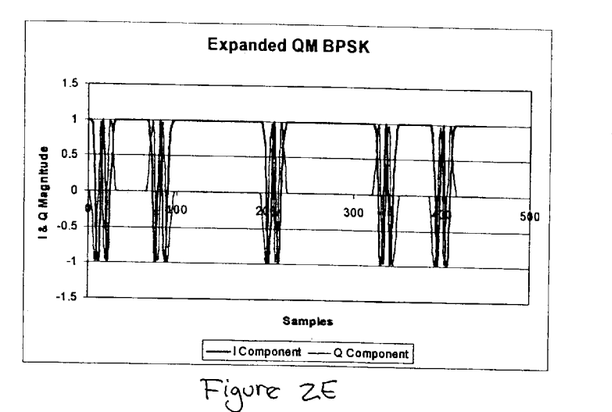
Figure 2F:
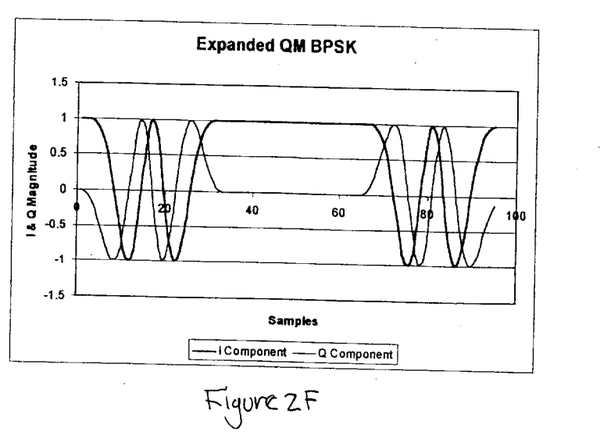

In contrast, FIGS. 2D–2F show an example of the over-modulation technique in which modulation is extended by a factor of N=4 times the conventional range (i.e., 4×180°= 720°). Specifically, FIG. 2D shows the range of the modulation waveform extending over 720°. FIGS. 2E and 2F show the affect of the modulation extension on the I and Q magnitude waveforms. Specifically, it can be seen that due to extending the modulation phase range, modulation transitions shown in FIG. 2F are greatly expanded across the sample interval of 0–80 samples when compared to the same sample interval of the conventional modulation I and Q waveforms (FIG. 2C).

As shown in FIG. 2A, quadrature over-modulation is performed on an information signal to generate an over-modulated quadrature signal having a modulation scale of N times an intended modulation scale. The over-modulated quadrature signal is then subsequently frequency divided by a factor of N. The net result is that any modulation distortion created during the quadrature modulation process is reduced by a factor of $20 \log_{10}(N)$ dB. It should be noted that the technique illustrated in FIG. 2A can include intervening signal processing steps between the quadrature over-modulation step and the frequency division step which is symbolized with the dashed line 22. As a result, dashed line 22 represents a derivative of the original quadrature over-modulated signal which can include the original quadrature over-modulated signal or a form of the original quadrature over-modulated signal after intervening signal processing steps. For instance, after over-modulation, the resulting over-modulated quadrature signal can be mixed with I and Q carrier signals to generate I and Q over-modulated RF signals as will be described herein below. However, it is to be understood that, in accordance with the technique of quadrature over-modulation shown in FIG. 2A, initially quadrature over-modulation is scaled by a factor of N times the intended modulation scaling and then subsequently (but not necessarily immediately afterwards), the over-modulated quadrature signal, or some form of the over-modulated quadrature signal, is frequency-divided by N having the net effect of reducing modulation distortion by a factor of $20 \log_{10}(N)$dB.

In one embodiment, the step of quadrature over-modulation generates a constant-envelope (angle) modulated quadrature signal including one of a phase or frequency over-modulated signal.

Figure 3:
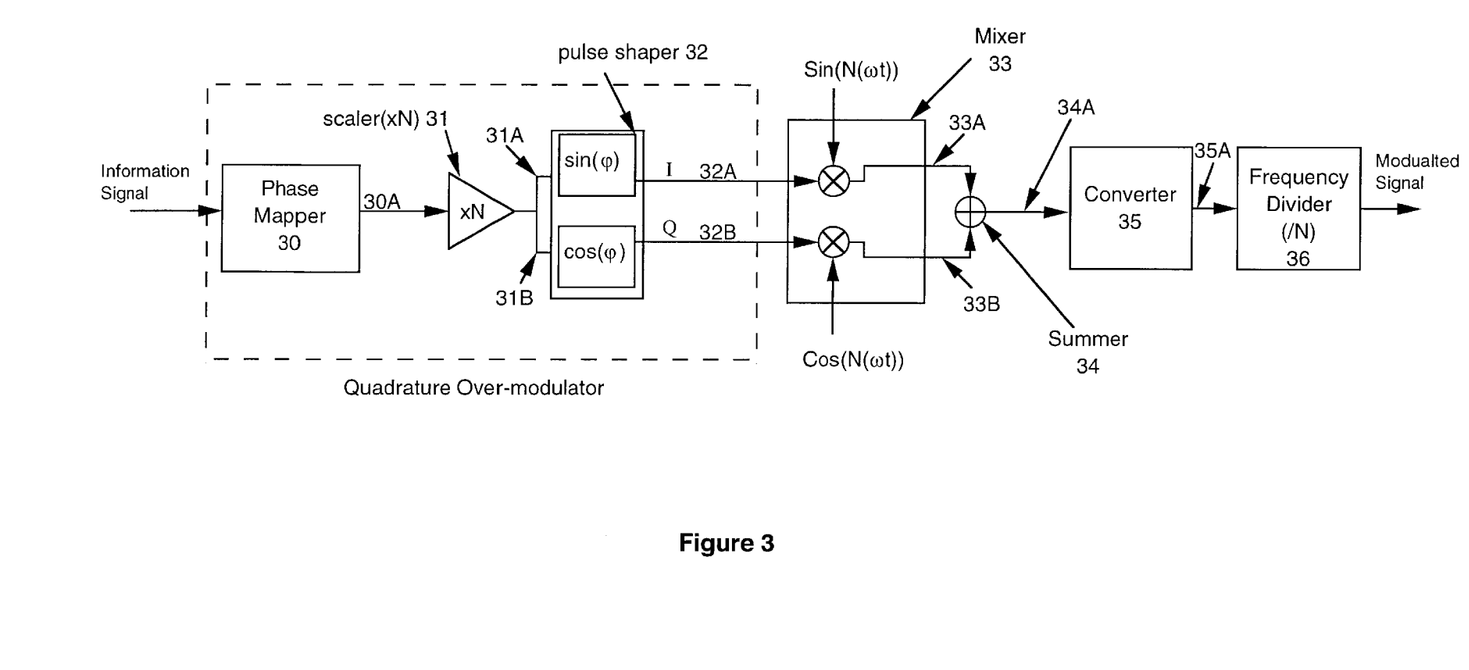
FIG. 3 shows an embodiment of a quadrature over-modulation system.

FIG. 3 shows an embodiment of a quadrature over-modulation system having reduced phase distortion for generating a modulated signal having an intended modulation scale and an intended carrier frequency. The embodiment of the quadrature over-modulation system shown in FIG.3 includes a quadrature over-modulation portion having a phase mapping block 30, a scaler 31, and a pulse shaper 32. The phase mapper 30 receives an information signal of "1"s and "0"s and converts/maps it to a pulse stream having phase modulation $\phi$ representative of the information signal that extends over an intended modulation range (e.g., modulation range =180°). The pulse stream 31A is coupled to a scaler 31 which scales or extends the modulation of the pulse stream over a phase range that is N times the conventional phase modulation range. The pulse stream is then split and shaped by pulse shaper 32 into I and Q component phase over-modulated sinusoidal signals 32A and 32B as shown in equations (1) and (2):

Signal 32A=I component=A Cos $N\phi(t)$ (1)

Signal 32B=Q component=A Sin $N\phi(t)$ (2)

each having an associated phase modulation scale that is N times the intended modulation scale. Signals 32A and 32B are each then mixed with carrier signals having frequencies $\omega_c$ multiplied by a factor of N times the intended carrier frequency to generate over-modulated signals 33A and 33B. In particular, as shown in FIG. 3, I component signal 32A is mixed with carrier signal Sin($N(\omega_c t)$) to generate over-modulated signal 33A and Q component signal 32B is mixed with carrier signal Cos(N(ω$_c$t)) to generate over modulated signal 33B as shown in equations (3) and (4) below:

$$\text{Signal } 33A = I \text{ Component} = \text{Sin}(N\omega(t)) \cdot A \cdot \text{Sin}(N\omega_c t) \quad (3)$$

$$\text{Signal } 33B = Q \text{ Component} = \text{Cos}(N\omega(t)) \cdot A \cdot \text{Cos}(N\omega_c t) \quad (4)$$

Signals 33A and 33B are summed by summer 34 to generate a single, constant-envelope over-modulated signal 34A:

$$\text{Signal } 34A = s(t) = A \text{ Cos}(N\omega_c t - N\omega(t)) \quad (5)$$

Signal converter 35 converts over-modulated signal 34A into a digital signal 35A. The digital frequency divider 36 then divides signal 35A by N to generate the desired phase modulated signal having the intended modulation scale and the intended carrier frequency as shown below in equation (6):

$$\text{Signal } 34 \div N = A \text{ Cos}(N\omega_c t - N\phi(t)) \div N = A \text{ Cos}(\omega_c t - \omega(t)) \quad (6)$$

In one embodiment, signal converter 35 is embodied as a hard limiter circuit which functions to limit the upper and lower amplitude swings of an analog signal so as to convert it into a square wave resembling a digital signal. Hence, signal 34A is converted from a characteristically analog signal to a characteristically digital signal. It should be noted that signal converter 35 can, in general, be embodied as any one-bit analog-to-digital converter circuit. In another embodiment of the system shown in FIG. 3, the digital frequency divider may be embodied as digital divider comprising a plurality of sequential right-shift registers. In other embodiments, the digital frequency divider may be implemented with a sequential state machine, cascaded flip-flops or subharmonic-locked loop circuit.

It should be noted that since there are only semantic differences between analog and digital phase and frequency modulation, all of the foregoing description with regard to phase modulation applies equally well to frequency modulation signals. In addition it should be further noted that the equivalent over-modulation for a frequency modulated signal corresponds to a N-multiple of the modulation index of the modulating signal. Hence, in the case of analog frequency over-modulation, the modulation index , is multiplied by a factor of N and in the case of digital frequency over-modulation the modulation index h is multiplied by a factor of N.

Figure 4A:
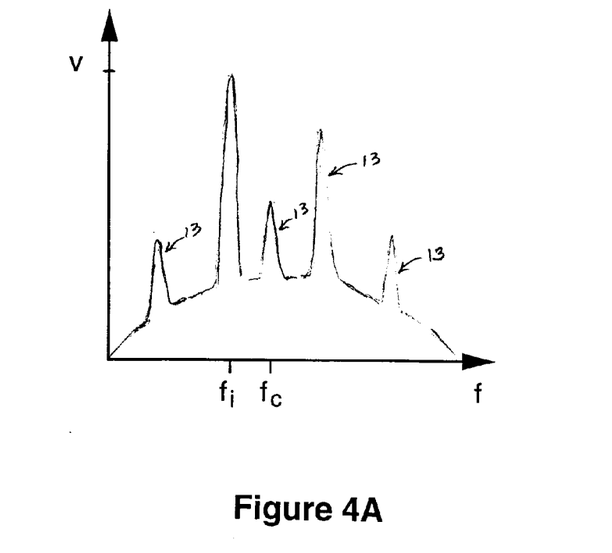
FIG. 4A shows an amplitude vs. frequency spectrum output response of the prior-art quadrature modulation system shown in FIG. 1.
Figure 4B:
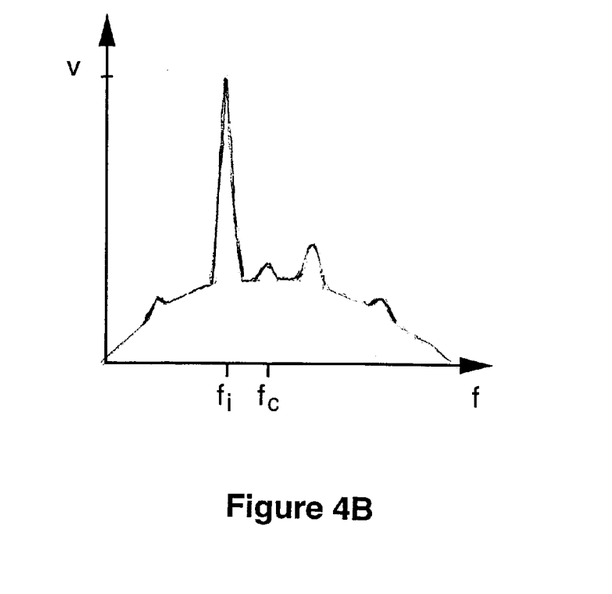
FIG. 4B shows an amplitude vs. frequency spectrum output response of the quadrature over-modulation system shown in FIG. 3.

FIGS. 4A and 4B are signal spectrum curves showing signal distortion resulting from each of the prior art quadrature modulation system (i.e., FIG. 1) and the quadrature over-modulation system (i.e., FIG. 3), respectively. Referring to FIG. 4A, the amplitude of signal distortion spikes 13 is nearly comparable in magnitude to the amplitude spike at the frequency of interest f$_i$. In comparison, FIG. 4B shows that the magnitude of the signal distortion spikes is greatly reduced and is negligible compared to the magnitude of the signal response at the frequency of interest. More specifically, the magnitude of the signal distortion component is reduced by a factor of 20 log$_{10}$(N). Commonly, the amplitude distortion exhibited in FIG. 4A is in the range of 35 dB–45 dB down from the peak amplitude of the signal response at f$_i$. In this case, by performing the technique of quadrature over-modulation, the amplitude distortion exhibited would be reduced to 55 db–65 db down from the peak amplitude of the signal response at f$_i$ for N>8.

Hence, a technique of quadrature over-modulation is described that initially over-modulates on a scale that is N times an intended modulation scale and then after over-modulation, frequency divides the resulting over-modulated signal by the same factor of N such that the phase distortion of the resulting modulated signal is reduced by a factor of 20 log$_{10}$(N)dB.

What is claimed is:

1. A method of modulating an information signal to generate an essentially constant-envelope modulated signal having an intended modulation scale and an intended carrier frequency, said method comprising the steps of:

quadrature over-modulating with said information signal to generate a constant-envelope over-modulated signal having a modulation scale that is N times the intended modulation scale; and frequency-dividing a derivative of said constant-envelope over-modulated signal by a factor of N;

wherein signal distortion that is created while quadrature over-modulating is logarithmically reduced by a factor of 20 log$_{10}$(N)dB.

2. The method as described in claim 1 wherein said step of quadrature over-modulating comprises performing phase over-modulation.

3. The method as described in claim 1 wherein said step of quadrature over-modulating comprises performing frequency over-modulation.

4. A method of modulation for generating a constant-envelope quadrature modulated signal from an information signal, said constant-envelope modulated signal having an intended modulation scale and an intended carrier frequency, said method essentially comprising the steps of:

using said information signal to generate constant-envelope over-modulated quadrature signal components, said over-modulated quadrature signal components having an associated modulation scale that is N times that of said intended modulation scale;

mixing said over-modulated quadrature signal components with first and second carrier signals each having an associated carrier frequency rate that is N times said intended carrier frequency rate to generate first and second over-modulated signals;

summing said first and second over-modulated signals to generate a single, over-modulated constant-envelope signal;

converting said single, over-modulated signal into a digital signal; and digitally frequency-dividing said digital signal by a factor of N to generate said constant-envelope quadrature modulated signal having said associated intended modulation scale and said intended carrier frequency.

5. The method as described in claim 4 wherein said step of quadrature over-modulating comprises phase over-modulating.

6. The method as described in claim 4 wherein said step of quadrature over-modulating comprises frequency over-modulating.

7. The method as described in claim 4 wherein said step of quadrature over-modulating comprises the steps of:

phase mapping the information signal so as to generate a phase modulated pulse stream having said intended modulation scale;

phase scaling said phase modulated pulse stream by a factor of N such that said scaled phase modulated pulse stream has said modulation scale that is N times that of said intended modulation scale;

generating an in-phase component of the scaled phase modulated pulse stream and a quadrature component of the scaled phase modulated pulse stream;

pulse shaping each of said in-phase component and said quadrature component of the phase modulated pulse stream to generate said over-modulated quadrature signal.

8. The system of modulation for generating a constant-envelope quadrature over-modulated signal from an information signal, said over-modulated signal having an intended modulation scale and an intended carrier frequency comprising:

a quadrature over-modulator for generating a constant-envelope over-modulated quadrature signal from an information signal, said over-modulated quadrature signal having an associated modulation scale that is N times that of said intended modulation scale;

a mixer for mixing I and Q components of said constant-envelope over-modulated quadrature signal with first and second carrier signals, respectively, so as to generate first and second over-modulated signals having an associated carrier frequency rate that is N times said intended carrier frequency rate;

a summer for summing said first and second over-modulated signals to generate a single, over-modulated signal;

a convertor for converting said single, over-modulated signal into a digital signal having an associated frequency; and a digital frequency divider for digitally dividing said associated frequency of said digital signal by N to generate said constant-envelope modulated signal having said intended modulation scale and said intended carrier frequency.

9. The system as described in claim 8 wherein said quadrature over-modulator performs phase over-modulation.

10. The system as described in claim 8 wherein said quadrature over-modulator performs frequency over-modulation.

11. The system as described in claim 8 wherein said quadrature over-modulator comprises:

a phase mapper converting the information signal into a phase modulated pulse stream having said intended modulation scale;

a phase scaler for increasing said intended modulation scale of said phase modulated pulse stream by a factor of N to generate a scaled phase over-modulated pulse stream; and a pulse shaper for converting the scaled phase over-modulated pulse stream into an in-phase sinusoidal component of the scaled pulse stream and a quadrature sinusoidal component of the scaled pulse stream which together form said over-modulated quadrature signal.

12. The system as described in claim 8 wherein said converter is a hard limiter circuit.

13. The system as described in claim 8 wherein said converter is a single bit analog-to-digital converter.

14. The system as described in claim 8 wherein said frequency divider comprises a plurality of sequential right shift registers.

15. The system as described in claim 8 wherein said frequency divider comprises a sequential state machine.

16. The system as described in claim 8 wherein said frequency divider comprises cascaded flip-flops.

17. The system as described in claim 8 wherein said frequency divider comprises a subharmonic-locked-loop.

* * * * *

UNITED STATES PATENT AND TRADEMARK OFFICE
CERTIFICATE OF CORRECTION

PATENT NO. : 6,650,711 B1 Page 1 of 1
DATED : November 18, 2003
INVENTOR(S) : Richard W. D. Booth It is certified that error appears in the above-identified patent and that said Letters Patent is hereby corrected as shown below:

Column 5,
Line 42, replace "," with -- index -- $\beta$ --.

Signed and Sealed this

Fifteenth Day of June, 2004

JON W. DUDAS
*Acting Director of the United States Patent and Trademark Office*